United States Patent
Tidrow et al.

(12)

(10) Patent No.: US 6,699,521 B1
(45) Date of Patent: Mar. 2, 2004

(54) METHOD OF FABRICATING A FERROELECTRIC/PYROELECTRIC INFRARED DETECTOR USING A CRYSTALLOGRAPHICALLY ORIENTED ELECTRODE AND A ROCK SALT STRUCTURE MATERIAL SUBSTRATE

(75) Inventors: Steven Tidrow, Silver Spring, MD (US); Meimei Tidrow, Silver Spring, MD (US)

(73) Assignee: The United States of America as represented by the Secretary of the Army, Washington, DC (US)

( * ) Notice: Subject to any disclaimer, the term of this patent is extended or adjusted under 35 U.S.C. 154(b) by 0 days.

(21) Appl. No.: 09/550,622

(22) Filed: Apr. 17, 2000

(51) Int. Cl.$^7$ ............................. B05D 5/12; H01L 21/00
(52) U.S. Cl. ......................... 427/100; 427/103; 438/3; 438/54
(58) Field of Search ................ 427/79, 80, 81, 427/100, 103; 438/3, 54

(56) References Cited

U.S. PATENT DOCUMENTS 5,914,507 A * 6/1999 Polla et al. .................. 257/254
6,020,216 A * 2/2000 Beratan et al. ............... 438/54

FOREIGN PATENT DOCUMENTS

JP      260018    * 9/1994
JP      300397    * 11/1995

OTHER PUBLICATIONS

A. Goyal, et al. "Material Characteristics Of Perovskite Manganese Oxide Thin Films For Bolometric Applications," Applied Physics Letters 71, Oct. 27, 1997, pp. 2535–2537.

Z. Trajanovic, et al. "Growth Of Colossal Magnetoresistance Thin Films On Silicon," Applied Physics Letters 69, Aug. 12, 1998, pp. 1005–1007.

* cited by examiner

*Primary Examiner*—Brian K. Talbot
(74) *Attorney, Agent, or Firm*—Paul S. Clohan; Mark D. Kelly; William Randolph

(57) ABSTRACT

A method of fabricating an uncooled ferroelectric/pyroelectric infrared detector having a semi-transparent electrode material includes using a lattice matched substrate material and a crystallographically oriented bottom electrode material as a template for the growth of a crystallographically oriented ferroelectric/pyroelectric film. In a second preferred embodiment, the method includes fabricating a detector assembly, inverting the assembly, and attaching the inverted assembly to a circuit. This embodiment avoids temperature processing constraints associated with the circuit, and thus facilitates the use of higher growth temperatures. Advantages associated with the embodiments of the present invention include the ability to fabricate a crystallographically oriented bottom electrode material as a template for the growth of a crystallographically oriented ferroelectric/pyroelectric film. Furthermore, once the fabrication is complete, the substrate upon which the electrode is deposited can be easily removed. Finally, by virtue of the crystallographically oriented ferroelectric/pyroelectric film, a significant improvement in the overall performance of the detector, and thus in a device such as a focal plane array, is achieved.

10 Claims, 4 Drawing Sheets

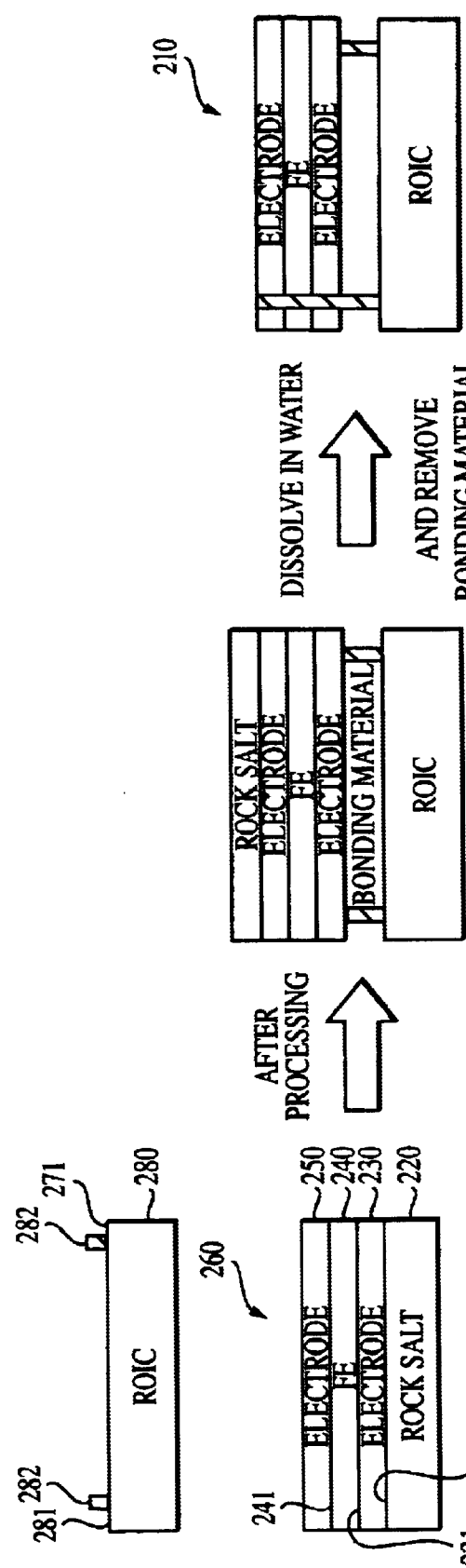

METHOD OF FABRICATING A FERROELECTRIC/PYROELECTRIC INFRARED DETECTOR USING A CRYSTALLOGRAPHICALLY ORIENTED ELECTRODE AND A ROCK SALT STRUCTURE MATERIAL SUBSTRATE

The invention described herein may be manufactured, used, and licensed by the U.S. Government for governmental purposes without the payment of any royalties thereon.

BACKGROUND OF THE INVENTION

1. Field of the Invention

This invention relates generally to uncooled infrared detectors and focal plane arrays, and more specifically to a method of fabricating an infrared. The invention relates more specifically to a method of fabricating a ferroelectric/pyroelectric detector. The invention relates even more specifically to a method of fabricating a detector using a rock salt structure material as a substrate and a crystallographically oriented bottom electrode material as a template for the growth of a crystallographically oriented ferroelectric/pyroelectric film.

2. Description of Related Art

Uncooled infrared thermal detectors have recently been made into large-size focal plane arrays (hereinafter "FPA"). For ferroelectric ("FE") and pyroelectric ("PE") infrared detectors, the detector structures are capacitors, in which the FE or PE ("FE/PE") thin film is disposed between top and bottom thin electrode layers. In one type of detector, the FE/PE thin film is disposed between a reflective bottom electrode and a semi-transparent top electrode. In this type of detector, the resonance of the absorption occurs within the detector structure itself. In a second type of detector, the FE/PE thin film is disposed between a transparent bottom electrode and a semi-transparent top electrode. In this type of detector, the resonance of the absorption occurs in the cavity between the detector structure and the reflecting layer of the readout integrated circuit ("ROIC").

In conventional FE/PE detectors, the bottom electrode is grown on top of a sacrificial layer, such as, polyimide or amorphous or randomly oriented materials. The subsequent FE/PE thin films are not, therefore, crystallographically oriented. By providing oriented FE/PE materials, however, the temperature coefficient of resistance ("TCR") in such detectors can be improved by a factor of as much as three.

For oriented growth of the FE/PE sensing materials, the electrode should provide a structure lattice match and be chemically compatible with the substance and the sacrificial layer. Further requirements include that the top and bottom electrode layers that sandwich the FE/PE material be semi-transparent, so that part of the light can pass through to allow multi-pass absorption, and that the sheet resistance of the electrode film be within a specific range of values in order to maximize the resonance absorption in the structure. Examples of lattice matching materials include "normal" metals such as Pt (lattice constant "a"=3.89 Å) and Pd (3.92 Å); conducting oxides such as $La_{1-x}Sr_xCoO_3$ ("LSCO") (3.8–3.9 Å); and colossal magneto-resistive ("CMR") materials such as $La_{1-x}Ca_xMnO_3$ (3.8–3.9 Å). As electrode materials, the normal metals, are less desirable than the semi-transparent conducting oxide and colossal magneto-resistive materials. Pt, for example, not only is not semi-transparent, but is highly reflective. In addition, with Pt, the formation of helices at the deposition temperatures required for growth of the crystalline FE/PE films causes further complications for the growth of oriented films.

Perovskite oxide materials are of interest for use as the FE/PE film due to their typically superior figure of merit, which translates into superior device performance. Many FE/PE materials with the perovskite oxide structure have an a and a b lattice constant of approximately 3.9 Å. Thus, materials that provide a lattice match to the perovskite oxide structure can be used both as a template for growth of perovskite oxides such as FE/PE materials, and as conducting oxides such as LSCO and CMR materials for use as semi-transparent electrodes.

The use of CMR materials for uncooled infrared detectors is described in Goyal et al., A., "Material Characteristics of Perovskite Manganese Oxide Thin Films for Bolometric Applications," Applied Physics Letters, Vol. 71 (17) (Oct. 27, 1997), pp. 2535–2537. CMR materials demonstrate an exceptionally large change in resistance with temperature as they transition from a ferromagnetic to a non-ferromagnetic phase. The transition temperature can be adjusted through appropriate selection of materials and process conditions. The results have demonstrated the feasibility of growing CMR thin films on perovskite oxide material substrates such as $LaAlO_3$ and $SrTiO_3$ with a resultant temperature coefficient of resistance of greater than 7%.

CMR materials have a perovskite crystal structure with a square base. The lattice constant a of the square base of a typical CMR material is approximately 3.8 to 3.9 Å depending on the material composition. As indicated above, CMR thin films have been successfully grown on perovskite oxide substrates such as $LaAlO_3$ and $SrTiO_3$, and exhibit a good crystal orientation and a high temperature coefficient of resistance. These perovskite oxide substrate materials are employed because of the correspondence of their crystal structure and lattice constant to those of CMR materials. For example, $SrTiO_3$ has a cubic crystal structure with a lattice constant of 3.905 Å, and $LaAlO_3$ has a pseudo-cubic crystal structure with a lattice constant of 3.79 Å. These properties facilitate the growth of a CMR material on $LaAlO_3$ and $SrTiO_3$ with a resultant high crystal orientation and quality. A disadvantage associated with use of these materials, however, is that both $LaAlO_3$ and $SrTiO_3$ are very difficult to remove once the detector array has been bonded to the ROIC.

Therefore, a general need exists to provide a method of fabricating an uncooled ferroelectric/pyroelectric infrared detector that includes a semi-transparent electrode material. A more specific need exists to provide a method of fabricating a detector having a crystallographically oriented ferroelectric/pyroelectric film. An even more specific need exists to provide such a method in which the substrate can be easily removed once fabrication of the detector has been completed.

SUMMARY OF THE INVENTION

It is an object of the present invention to provide a method of fabricating an uncooled ferroelectric/pyroelectric infrared detectors and arrays that comprises a semi-transparent electrode material.

It is a further object of the present invention to provide a method of fabricating detector arrays using lattice matched substrate materials and a crystallographically oriented bottom electrode material as a template for the growth of a crystallographically oriented ferroelectric/pyroelectric film.

It is a still further object of the present invention to provide a method in which the substrate can be easily removed once fabrication of the detector array has been completed.

Accordingly, in a first preferred embodiment, the present invention advantageously relates to a method of fabricating a ferroelectric/pyroelectric detector using a thin film transfer method comprising deposition of a rock salt structure material substrate on a lattice matched reflecting metal layer. The method comprises (a) depositing a lattice matched reflecting metal layer on a top surface of a circuit; (b) depositing a rock salt structure material substrate as a sacrificial layer on a deposition surface of the metal layer; (c) depositing a lattice matched and crystallographically oriented first electrode layer on a deposition surface of the rock salt substrate layer; (d) depositing a lattice matched and crystallographically oriented ferroelectric/pyroelectric film layer on a deposition surface of the first electrode layer; (e) depositing a second electrode layer on a deposition surface of the ferroelectric/pyroelectric film layer; and (f) removing the rock salt structure material sacrificial layer.

By using a rock salt structure material such as, for example, NaCl, LiF, NaF, KF, or KCl as the sacrificial layer, a crystallographically oriented bottom electrode material can be grown, which then serves as a template for the growth of a crystallographically oriented ferroelectric/pyroelectric film. The rock salt sacrificial layer can be removed using water, and the excess solution can then be removed by a method such as evaporation, triple-point, or freeze drying.

In a second preferred embodiment, the present invention relates to a method comprising fabricating a detector array assembly, inverting the assembly, and attaching the inverted assembly to the ROIC. This embodiment avoids temperature processing constraints associated with the ROIC, and thus facilitates the use of higher growth temperatures. The method comprises (a) depositing a first electrode layer on the rock salt substrate or buffered rock salt substrate, or a substrate buffered with rock salt; (b) depositing a lattice matched and crystallographically oriented ferroelectric/pyroelectric film layer on a deposition surface of the first electrode layer; (c) depositing a lattice matched and crystallographically oriented second electrode layer on a deposition surface of the ferroelectric/pyroelectric film layer to form a detector assembly; (d) inverting the detector assembly; (e) depositing a lattice matched reflecting metal layer on a top surface of a circuit; (f) attaching the inverted detector assembly to an attachment surface of the metal layer with a bonding material; and (g) removing the rock salt structure material substrate.

By employing the second preferred embodiment, the growth and processing temperatures can be higher than those employed when the electrode and FE/PE materials are grown in close proximity to the ROIC, thus yielding materials of higher crystal orientation and even higher quality.

Advantages associated with the embodiments of the present invention include the ability to fabricate a crystallographically oriented bottom electrode material using rock salt as a template for the growth of a crystallographically oriented ferroelectric/pyroelectric film. Furthermore, once the fabrication is complete, the substrate upon which the bottom electrode is deposited can be easily removed. Finally, by virtue of the crystallographically oriented ferroelectric/pyroelectric film, a significant improvement in the overall performance of the detector, and thus the focal plane array, is achieved.

BRIEF DESCRIPTION OF THE DRAWINGS

Other objects, features, and advantages of the present invention will become more fully apparent from the following detailed description of the preferred embodiments, the appended claims, and the accompanying drawings. As depicted in the attached drawings:

FIGS. 2A–C are schematic representations of a detector constructed in accordance with a second preferred embodiment of the invention comprising assembly of the detector elements separate from the readout integrated circuit.

DESCRIPTION OF THE PREFERRED EMBODIMENTS

The present invention will be disclosed in terms of the currently perceived preferred embodiments thereof.

To facilitate the growth of electrode materials with the desired crystal orientation for use in infrared detectors, a basic epitaxial relation and lattice match should exist between the substrate material and the electrode material. Rock salt structure materials have cubic crystal structures with lattice constants suitable for the growth of such electrode materials.

There are several conducting oxide electrode materials that have the perovskite structures with an a and a b lattice constant of approximately 3.8 to 3.9 Å. Rock salt has a cubic crystal structure. LiF has a lattice constant a=4.02 Å, which matches the conducting oxide material very well, with only slight tensile strain. NaCl has a lattice constant a=5.64 Å, hence, to match the lattice constant, conducting oxide materials may be grown epitaxially, but with slight tensile strain along the <110> direction of the NaCl. KF has a lattice constant a=5.34758 Å, hence, to match the lattice constant, conducting oxide materials may be grown epitaxially, but with slight compressive strain along the <110> direction of the KF.

Therefore, when a rock salt structure material is used as a substrate, conducting oxide materials can be grown directly on such a substrate.

Figure 1B:
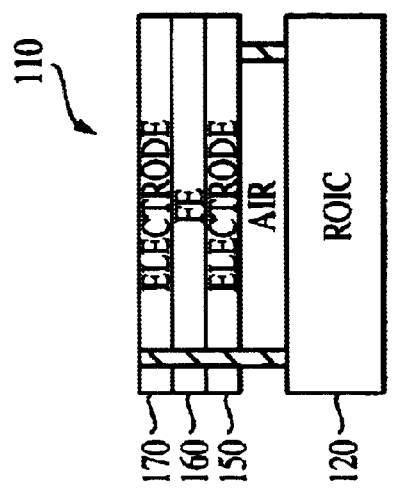
FIGS. 1A and B are schematic representations of a detector constructed in accordance with a first preferred embodiment of the invention comprising assembly of the detector elements on top of the readout integrated circuit.
Figure 1A:
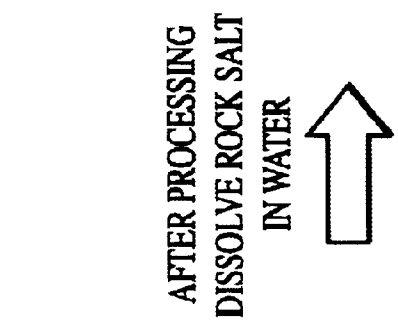

FIGS. 1A and B are schematic representations of a detector 110 (FIG. 1B) constructed in accordance with a first preferred embodiment of the invention comprising a rock salt structure material as a substrate. The method of fabricating detector 110 comprises the following series of steps. First a lattice matched metal layer 130 is deposited on a top surface 121 of a circuit 120. Metal layer 130 comprises a "normal" metal such as Pt or Pd. Top surface 121 comprises a plurality of metal structural support members 122.

Next, a rock salt structure material sacrificial layer (also as a template layer) 140 is deposited on a deposition surface 131 of metal layer 130. Sacrificial layer 140 has a thickness of approximately 2μm, and comprises either rock salt (i.e., NaCl) or a material having the structure of rock salt such as, for example, LiF, NaF, KF, or KCl. In a preferred embodiment, LiF is employed as the rock salt structure material.

A lattice matched and crystallographically oriented first electrode layer 150 is then deposited on a deposition surface 141 of substrate layer 140. First electrode layer 150 comprises a material selected from the group consisting of conducting oxide materials and colossal magneto-resistive materials. The conducting oxide material can be, for example, a material having the general formula $La_{1-x}Sr_xCoO_3$, and the colossal magneto-resistive material can be, for example, a material having the general formula $La_{1-x}Ca_xMnO_3$. Next, a lattice matched and crystallographically oriented ferroelectric/pyroelectric film layer 160 is deposited on a deposition surface 151 of first electrode layer 150. Ferroelectric/pyroelectric film layer 160 comprises a perovskite oxide structure material.

A second electrode layer 170 is then deposited on a deposition surface 161 of ferroelectric/pyroelectric film layer 160. Second electrode layer 170 can comprise either a lattice matched and crystallographically oriented material such as the conducting oxide materials and colossal magneto-resistive materials employed in first electrode layer 150, or can comprise an amorphous material.

Finally, rock salt structure material sacrificial layer 140 is removed. Removal of layer 140 can be accomplished by dissolving the rock salt structure material substrate in water. Excess water solution can then be removed by a water rinse and a method such as evaporation, triple-point, or freeze drying.

FIGS. 2A–C are schematic representations of a detector 210 (FIG. 2C) constructed in accordance with a second preferred embodiment of the invention. In this embodiment, the present invention relates to a method comprising fabricating a detector assembly, inverting the assembly, and attaching the inverted assembly to the ROIC. This embodiment avoids temperature processing constraints associated with the ROIC, and thus facilitates the use of higher growth temperatures. Higher growth temperatures usually yield materials having a higher quality and crystal orientation.

The method of fabricating detector 210 comprises the following series of steps. First, a rock salt substrate is selected. It can be either rock salt (i.e., NaCl) or a material having the structure of rock salt such as, for example, LiF, NaF, KF, or KCl. In a preferred embodiment, LiF is employed as the rock salt structure material. It can be used as either a substrate or it can be deposited as a rock salt layer on a substrate as a template layer.

Next, a first electrode layer 230 is deposited on a deposition surface 221 of substrate layer 220. First electrode layer 230 can comprise either a lattice matched and crystallographically oriented material such as conducting oxide materials and colossal magneto-resistive materials, or comprise an amorphous material.

A lattice matched and crystallographically oriented ferroelectric/pyroelectric film layer 240 is then deposited on a deposition surface 231 of first electrode layer 230. Ferroelectric/pyroelectric film layer 240 comprises a perovskite oxide structure material.

Next, a lattice matched and crystallographically oriented second electrode layer 250 is deposited on a deposition surface 241 of ferroelectric/pyroelectric film layer 240 to form a detector assembly 260. Detector assembly 260 is then inverted, so that second electrode layer 250 becomes the bottom electrode and first electrode layer 230 becomes the top electrode.

A lattice matched reflecting metal layer 270 is then deposited on a top surface 281 of a circuit 280. Metal layer 270 comprises a "normal" metal such as Pt or Pd. Top surface 281 comprises a plurality of metal structural support members 282.

Next, inverted detector assembly 260 is attached to an attachment surface 271 of metal layer 270 with a bonding material. Rock salt structure material substrate layer 220 is then removed. Removal of substrate layer 220 can be accomplished by dissolving the rock salt structure material substrate in water. Excess rock salt structure material/water solution can then be removed by a water rinse and a method such as evaporation, triple-point, or freeze drying.

Polarization of the ferroelectric/pyroelectric material deposited in accordance with either of the aforementioned embodiments reveals that the polarization is effectively three times larger for the resultant c-axis oriented films compared with films having randomly oriented FE/PE material.

EXAMPLE

Figure 3:
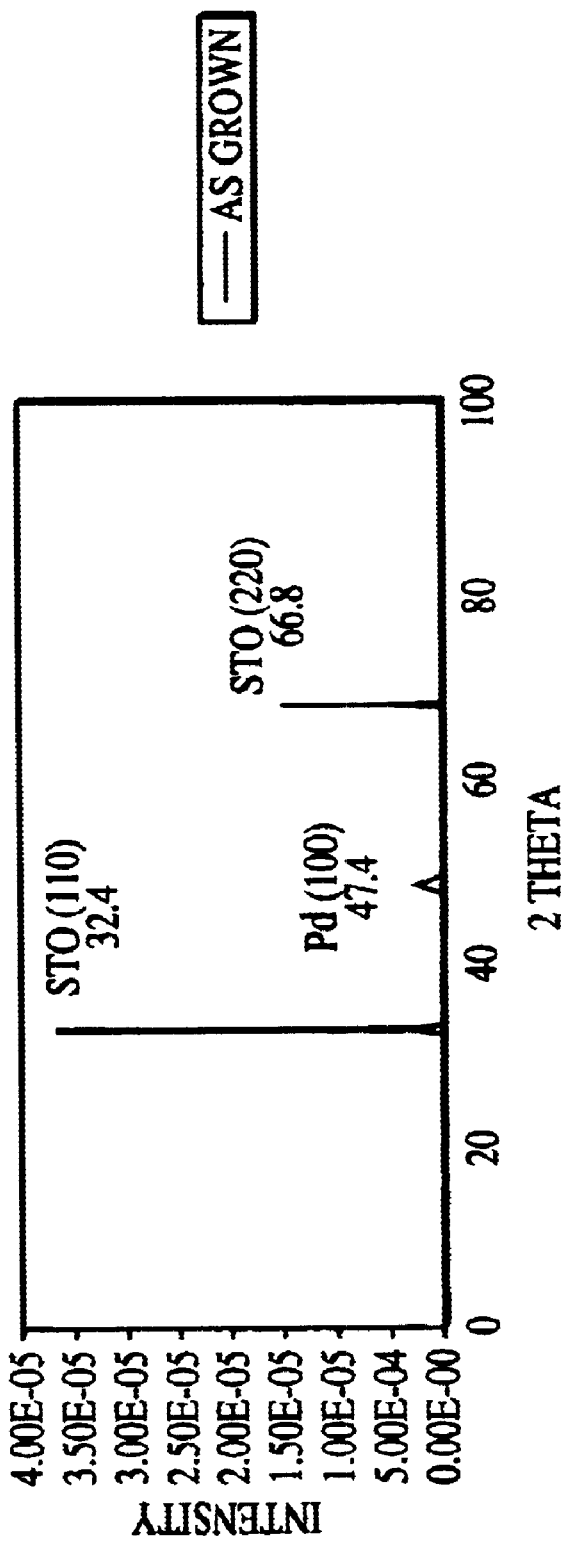
FIG. 3 is a graphical representation of a pre-substrate removal x-ray diffraction pattern associated with an embodiment of the present invention in which $SrTiO_3$ was deposited on NaCl with Pd as a thin buffer layer.

FIG. 3 is a graphical representation of a pre-substrate removal x-ray diffraction pattern associated with an embodiment of the present invention in which an $SrTiO_3$ film was deposited on NaCl with Pd serving as a thin buffer layer. The embodiment represented by the graph depicted in FIG. 3 shows strong crystal (110) orientation before the substrate removal.

Figure 4:
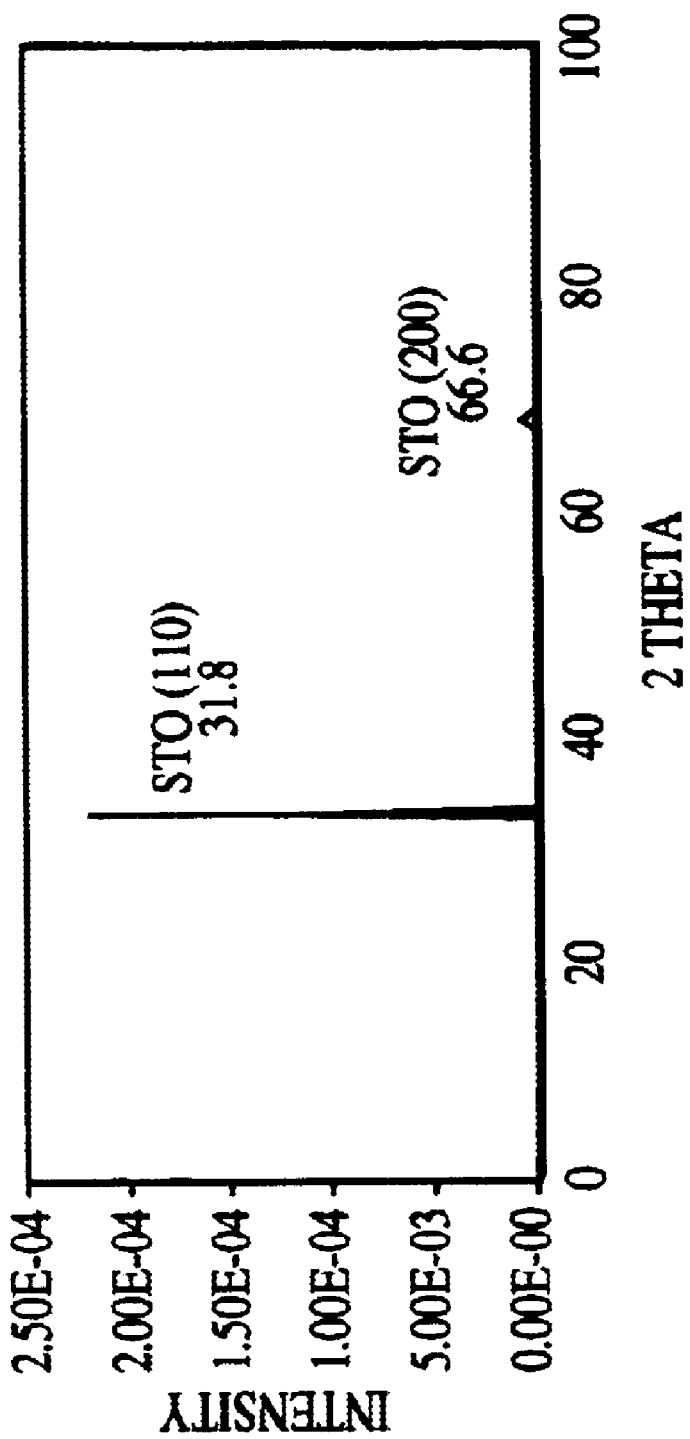
FIG. 4 is a graphical representation of a post-substrate removal x-ray diffraction pattern associated with the embodiment depicted in FIG. 3.

FIG. 4 is a graphical representation of a post-substrate removal x-ray diffraction pattern associated with the embodiment depicted in FIG. 3. The x-ray diffraction pattern shows that the strong crystal orientation of the $SrTiO_3$ film remained even after the NaCl substrate had been removed.

The embodiments of the present invention, therefore, provide a method of fabricating a detector using a lattice matched substrate material and a crystallographically oriented bottom electrode material as a template for the growth of a crystallographically oriented ferroelectric/pyroelectric film. Advantages associated with the embodiments of the present invention include both the use of a substrate which can be easily removed, and by virtue of the crystallographically oriented ferroelectric/pyroelectric film, a significant improvement in the overall performance of the detector, and thus the focal plane array. While only certain preferred embodiments of this invention have been shown and described by way of illustration, many modifications will occur to those skilled in the art. For example, while the method has been described in the context of a ferroelectric/pyroelectric detector application, it is equally applicable to any service requiring a high quality film produced by a thin film transfer method which uses an easily removable material as either a substrate or as a layer.

By way of further example of modifications within the scope of this invention, while the method has been described in the first and second preferred embodiments respectively as comprising the use of a single rock salt structure material substrate or layer, another embodiment could comprise the use of a plurality of the aforementioned substrates or layers.

By way of further example of modifications within the scope of this invention, while the method has been described in the first and second preferred embodiments as comprising the deposition of the rock salt structure material substrate layer on the reflecting metal layer, another embodiment could comprise the deposition of the substrate directly on the surface of the readout integrated circuit.

It is, therefore, desired that it be understood that it is intended herein to cover all such modifications that fall within the true spirit and scope of this invention.

What is claimed is:

1. A method of fabricating a crystallographically oriented ferroelectric/pyroelectric film infrared detector using a thin film transfer method, said method of fabricating comprising:

(a) depositing a lattice matched reflecting metal layer on a top surface of a circuit, said top surface comprising a plurality of metal structural support members;

(b) depositing a rock salt structure material substrate layer on a deposition surface of said metal layer;

(c) depositing a lattice matched and crystallographically oriented first electrode layer on a deposition surface of said substrate layer;

(d) depositing a lattice matched and crystallographically oriented ferroelectric/pyroelectric film layer on a deposition surface of said first electrode layer;

(e) depositing a second electrode layer on a deposition surface of said ferroelectric/pyroelectric film layer; and (f) removing said rock salt structure material substrate.

2. A method according to claim 1, wherein said rock salt structure material substrate is a material selected from the group consisting of NaCl, LiF, NaF, KF, and KCl.

3. A method according to claim 1, wherein said first electrode layer comprises a material selected from the group consisting of conducting oxide materials and colossal magneto-resistive materials.

4. A method according to claim 3, wherein said conducting oxide material is of the general formula $La_{1-x}Sr_xCoO_3$.

5. A method according to claim 3, wherein said colossal magneto-resistive material is of the general formula $La_{1-x}Ca_xMnO_3$.

6. A method according to claim 1, wherein said ferroelectric/pyroelectric film layer comprises a perovskite oxide structure material.

7. A method according to claim 1, wherein said second electrode layer comprises a lattice matched and crystallographically oriented material.

8. A method according to claim 1, wherein said second electrode layer comprises an amorphous material.

9. A method according to claim 1, wherein step (f) comprises dissolving said rock salt structure material substrate in water, and said method further comprises:

(g) removing excess rock salt structure material/water solution.

10. A method according to claim 9, wherein step (g) is carried out by a method selected from the group consisting of evaporation, triple-point, and freeze-drying.

* * * * *